US010209578B2

(12) United States Patent
Huang et al.

(10) Patent No.: US 10,209,578 B2
(45) Date of Patent: Feb. 19, 2019

(54) DISPLAY PANEL

(71) Applicant: AU Optronics Corp., Hsin-Chu (TW)

(72) Inventors: Sheng-Shuo Huang, Hsin-Chu (TW);
Sheng-Hsuan Tseng, Hsin-Chu (TW);
Chih-Hsien Chi, Hsin-Chu (TW);
Shih-Pin Cheng, Hsin-Chu (TW);
Mei-Hui Lee, Hsin-Chu (TW); Ying-Ju Huang, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 100 days.

(21) Appl. No.: 15/206,301

(22) Filed: Jul. 10, 2016

(65) Prior Publication Data

US 2017/0059914 A1 Mar. 2, 2017

(30) Foreign Application Priority Data

Aug. 26, 2015 (TW) .............................. 104127846 A

(51) Int. Cl.
*G02F 1/1333* (2006.01)
*G02F 1/1339* (2006.01)
*H01L 27/12* (2006.01)
*H01L 27/13* (2006.01)
*G02F 1/1368* (2006.01)

(52) U.S. Cl.
CPC ........ *G02F 1/13394* (2013.01); *H01L 27/124* (2013.01); *H01L 27/1218* (2013.01);
(Continued)

(58) Field of Classification Search
CPC ............... G02F 1/13394; G02F 1/1368; G02F 1/136286; G02F 1/133514;
(Continued)

(56) References Cited

U.S. PATENT DOCUMENTS

2005/0275328 A1* 12/2005 Tseng .................. G02F 1/13394
313/292
2006/0146222 A1   7/2006 Kim
(Continued)

FOREIGN PATENT DOCUMENTS

| CN | 1797132 A | 7/2006 |
|----|-----------|--------|
| CN | 1892378 A | 1/2007 |
| CN | 102749773 A | 10/2012 |

*Primary Examiner* — Charles S Chang
(74) *Attorney, Agent, or Firm* — McClure, Qualey & Rodack, LLP

(57) ABSTRACT

A display panel includes a first substrate structure, a second substrate structure and a display medium layer. The first substrate structure includes a first substrate, a transmitting line, a first protrusion structure and a second protrusion structure. The transmitting line, the first protrusion structure and the second protrusion structure are disposed on the first substrate. The second substrate structure includes a second substrate and a first spacer. The first spacer is disposed on the second substrate. The shape of a vertical projection of the first spacer projected on the first substrate is a polygonal shape having a first side, a second side, a third side, a first included angle and a second included angle. The first included angel is between the first side and the third side, and the first included angle is greater than 90 degrees. The second included angle is less than 90 degrees.

20 Claims, 14 Drawing Sheets

(52) U.S. Cl.
CPC .......... *H01L 27/1248* (2013.01); *H01L 27/13* (2013.01); *G02F 1/1368* (2013.01); *G02F 2001/13398* (2013.01)

(58) Field of Classification Search
CPC ......... G02F 1/133512; G02F 1/133516; G02F 1/1339; G02F 2001/133519; H01L 27/124; H01L 27/1248; H01L 27/13; H01L 27/1218
USPC .................................................. 349/155–157
See application file for complete search history.

(56) References Cited

U.S. PATENT DOCUMENTS

| | | | |
|---|---|---|---|
| 2006/0290873 A1 | 12/2006 | Yang | |
| 2007/0139604 A1* | 6/2007 | Paik .................... | G02F 1/13394 349/156 |
| 2008/0123007 A1* | 5/2008 | Cui .................... | G02F 1/13394 349/43 |
| 2008/0151172 A1 | 6/2008 | Kondo | |
| 2009/0310075 A1* | 12/2009 | Kim .................. | G02F 1/133707 349/144 |
| 2012/0268699 A1 | 10/2012 | Min | |
| 2013/0021552 A1* | 1/2013 | Tomioka ............. | G02F 1/13392 349/43 |
| 2014/0049714 A1* | 2/2014 | Yoshida .............. | G02F 1/13394 349/42 |
| 2014/0071391 A1* | 3/2014 | Yang ................ | G02F 1/133371 349/138 |
| 2015/0185566 A1* | 7/2015 | Choi ................ | G02F 1/134336 349/42 |

\* cited by examiner

DISPLAY PANEL

BACKGROUND OF THE INVENTION

1. Field of the Invention

The present invention relates to a display panel, and more particularly, to a display panel able to decrease the problems of vacuum bubbles, dislocation light leakage and mura.

2. Description of the Prior Art

Since the liquid crystal display panel has advantages of less volume and weight, and energy-efficiency, it is used extensively in every kind of electronic product. The liquid crystal display panel mainly includes two substrates set opposite to each other and a liquid crystal layer between the two substrates, wherein the two substrates are supported and formed the gap between them by spacers and the liquid crystal layer is inside the gap.

In transportation or usage, the liquid crystal display panel may be impacted or beaten unavoidably, then the spacers displace and not recover, the distance between the two substrates is changed, the problems of the uneven gap and vacuum bubbles is generated, and the quality of displaying is influenced, such as the liquid crystal display panel generate the mura easily. As the resolution of the liquid crystal display panel increases and the dimension of the pixel decreases, the assignment of the spacers are limited and the above problems caused by displacement of the spacers will be more serious.

SUMMARY OF THE INVENTION

One of the objectives of the present invention is to provide a display panel thereof decreasing the problems of vacuum bubbles, dislocation light leakage and mura.

To achieve the above objective, one of the embodiments of the present invention provides a display panel that includes a first substrate structure, a second substrate structure and a display medium layer. The first substrate structure includes a first substrate, a transmitting line, a first protrusion structure and the second protrusion structure. The first substrate has a first surface. The transmitting line is disposed on the first surface of the first substrate. The first protrusion structure and the second protrusion structure are disposed on the first surface of the first substrate, wherein the first protrusion structure and the second protrusion structure are overlapping with the transmitting line. The second substrate structure includes a second substrate and a first spacer. The second substrate has a second surface, wherein the second surface faces the first surface. The first spacer is disposed on the second surface of the second substrate, wherein a shape of a vertical projection of the first spacer projected on the first surface is a polygonal shape having a plurality of sides and a plurality of included angles which are between any two adjacent sides of the polygonal shape respectively, the sides comprise at least a first side, a second side, and a third side, and the included angles comprise a first included angle and a second included angle, wherein the first side and the second side are parallel with the transmitting line, and the first side and the third side are connected. The first included angle is between the first side and the third side and is greater than 90 degrees, and the second included angle is less than 90 degrees, wherein the vertical projection of the first spacer on the first substrate and a vertical projection of the transmitting line overlap, and the vertical projection of the first spacer is disposed between a center of a pattern of a vertical projection of the first protrusion structure on the first substrate and a center of a pattern of a vertical projection of the second protrusion structure on the first substrate. The display medium layer is disposed between the first substrate structure and the second substrate structure.

To achieve the above objective, another of the embodiments of the present invention provides a display panel that includes a first substrate structure, a second substrate structure and a display medium layer. The first substrate structure includes a first substrate, a scan line, a first data line, a thin film transistor, a protrusion structure and a first pixel electrode. The scan line and the first data line are disposed on the first substrate and interlaced with each other, wherein the scan line extends along a first direction. The thin film transistor is disposed on the scan line of the first substrate and electrically connected to the scan line and the first data line. The protrusion structure is disposed on the first substrate and adjacent to the thin film transistor, wherein the protrusion structure and the scan line overlap. The first pixel electrode is electrically connected to the thin film transistor. The second substrate structure is opposite to the first substrate structure, and the second substrate structure includes a second substrate and a first spacer. The first spacer is disposed on the second substrate, wherein a shape of a vertical projection of the first spacer projected on the first substrate is a polygonal shape having a plurality of sides and a plurality of included angles which are between any two adjacent sides of the polygonal shape respectively, the sides comprise at least a first side, a second side, and a third side, and the included angles comprise a first included angle and a second included angle, wherein the first side and the second side are parallel with the scan line, the first side and the third side are connected, the first included angle is between the first side and the third side, the first included angle is greater than 90 degrees, and the second included angle is less than 90 degrees, wherein the vertical projection of the first spacer on the first substrate and a vertical projection of the scan line overlap, and the vertical projection of the first spacer is disposed between a center of a pattern of a vertical projection of the thin film transistor on the first substrate and a center of a pattern of a vertical projection of the protrusion structure on the first substrate. The display medium layer is disposed between the first substrate structure and the second substrate structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1A:
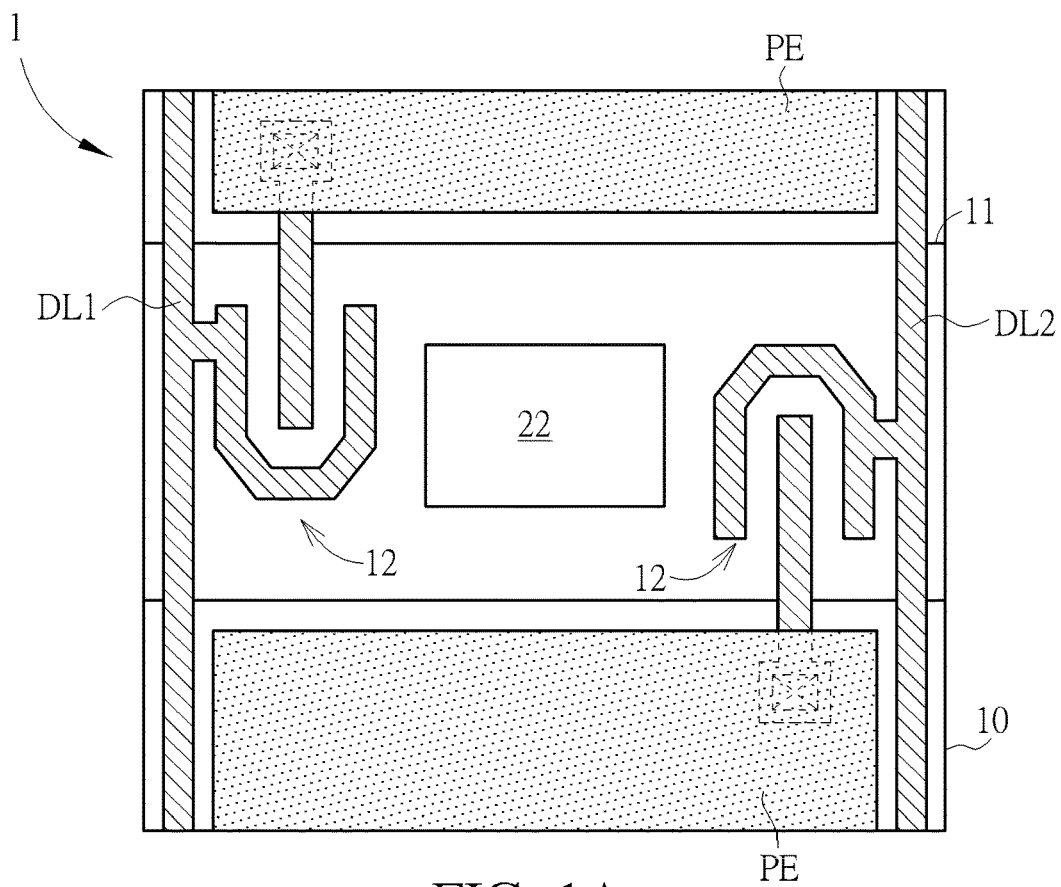
FIG. 1A is a schematic diagram of the top view of the display panel according to the control embodiment of the present invention.
Figure 1B:
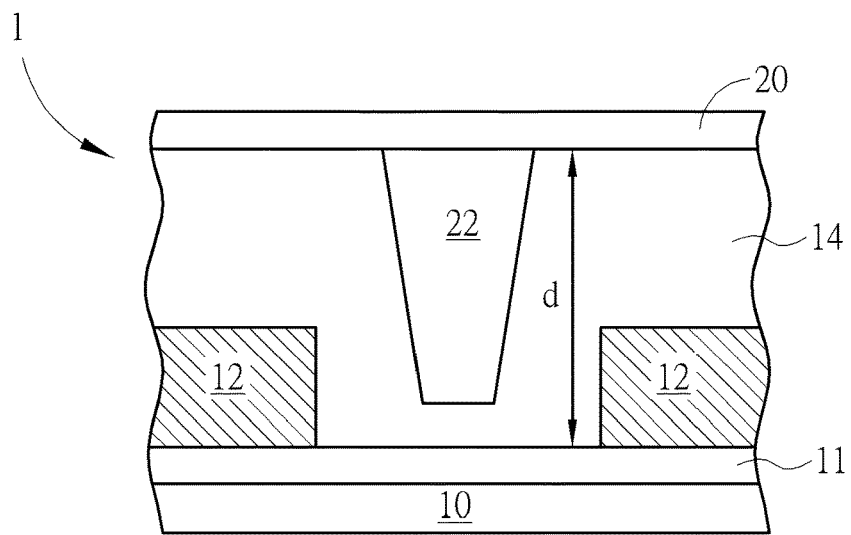
FIG. 1B is a cross-sectional view diagram of the display panel according to the control embodiment of the present invention.

Referring to FIG. 1A and FIG. 1B, FIG. 1A is a schematic diagram of the top view of the display panel according to the control embodiment of the present invention, and FIG. 1B is a cross-sectional view diagram of the display panel according to the control embodiment of the present invention. As shown in FIG. 1A and FIG. 1B, the display panel 1 of the control embodiment includes a first substrate 10, a second substrate 20, a transmitting line 11, a spacer 22, a protrusion structure 12, a pixel electrode PE and a display medium layer 14. The first substrate 10 and the second substrate 20 are set opposite to each other, and a gap d is between the first substrate 10 and the second substrate 20. The spacer 22 is disposed on the second substrate 20 and extends towards the first substrate 10, and the spacer 22 having a rectangular shape of a vertical projection on the first substrate 10 is disposed between the two adjacent protrusion structures 12. The protrusion structure 12 is disposed on the first substrate 10. According to the control embodiment, the two protrusion structure 12 which maybe a thin film transistor such as the thin film transistor (TFT) are electrically connected to the first data line DL1 and the second data line DL2 respectively, and the spacer 22 may be a sub spacer. When the display panel 1 is in the normal condition (for example not being beaten), the spacer 22 cannot contact the first substrate 10. The display medium layer 14 may be a liquid crystal layer.

Figure 1C:
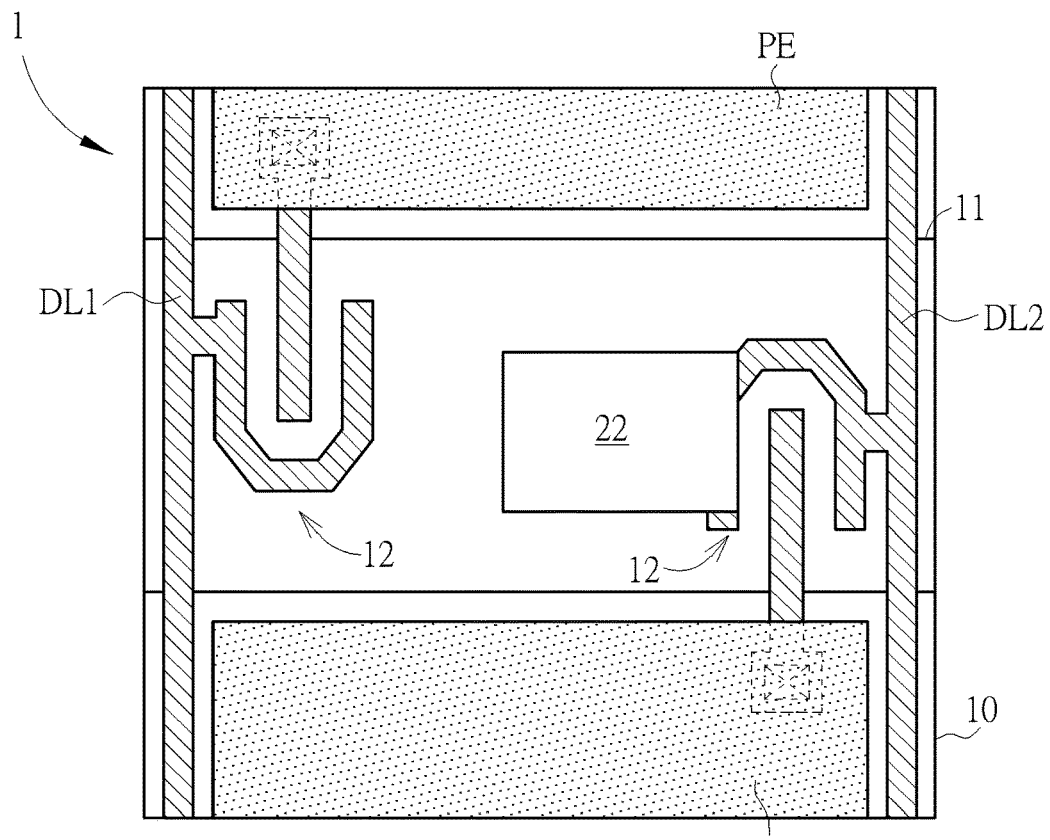
FIG. 1C is a schematic diagram of the top view of the display panel after being beaten according to the control embodiment of the present invention.
Figure 1D:
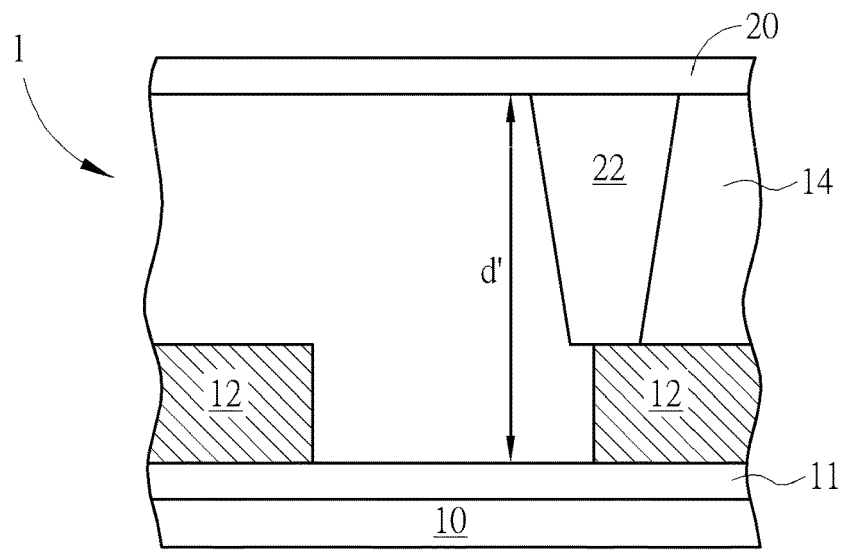
FIG. 1D is a cross-sectional view diagram of the display panel after being beaten according to the control embodiment of the present invention.

In transportation or usage, the display panel 1 may be impacted or beaten by an external force unavoidably and make the spacer 22 displace. Referring to FIG. 1C and FIG. 1D, FIG. 1C is a schematic diagram of the top view of the display panel after being beaten according to the control embodiment of the present invention, and FIG. 1D is a cross-sectional view diagram of the display panel after being beaten according to the control embodiment of the present invention. As shown in FIG. 1C and FIG. 1D, after the display panel 1 of the control embodiment is beaten, the spacer 22 often shifts on the protrusion structure 12 and the spacer 22 would generate a bigger gap d' between the first substrate 10 and the second substrate 20, and in this condition, the gap cannot be filled with the liquid crystal completely, therefore, the optical path difference of the incident light would change and the vacuum bubbles would be generated in the influenced area, the first substrate 10 and the second substrate 20 would generate a relative displacement and have the problem of dislocation light leakage and mura, and the quality of displaying would be influenced.

Figure 2A:
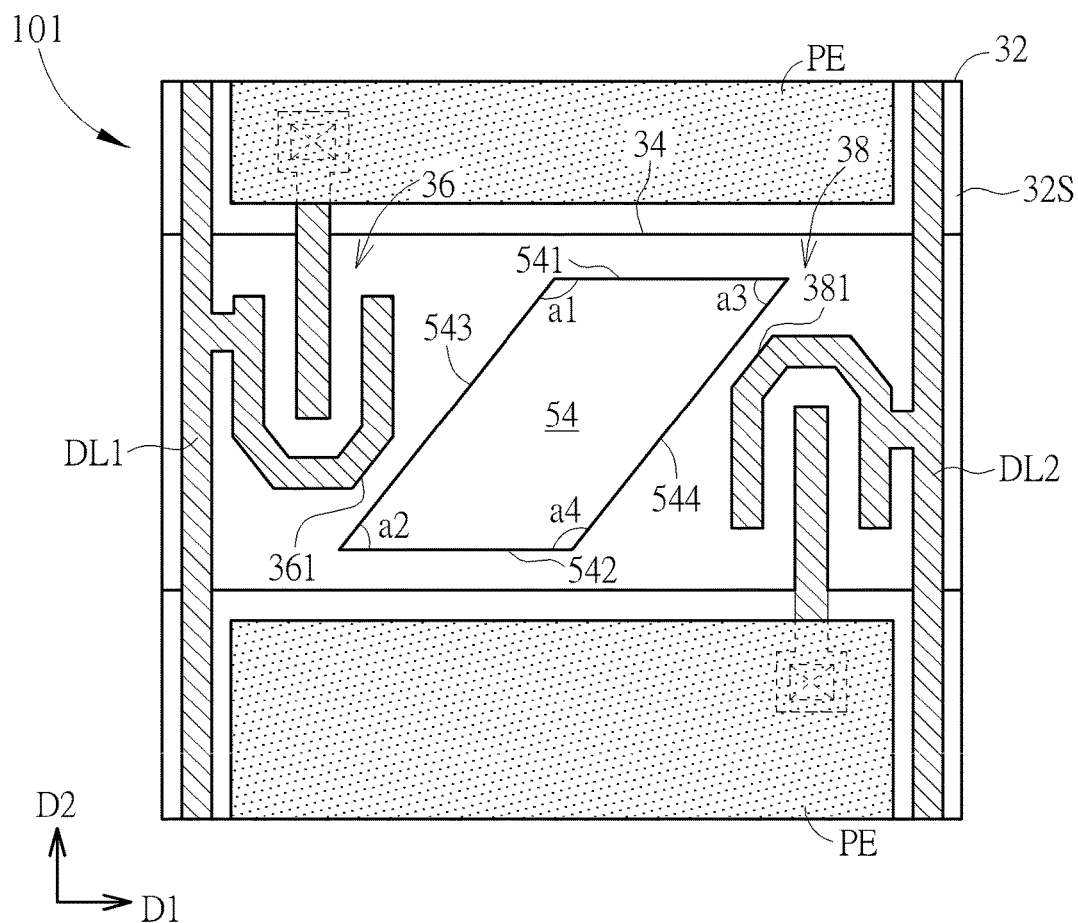
FIG. 2A is a schematic diagram of the top view of the display panel according to the first embodiment of the present invention.
Figure 2B:
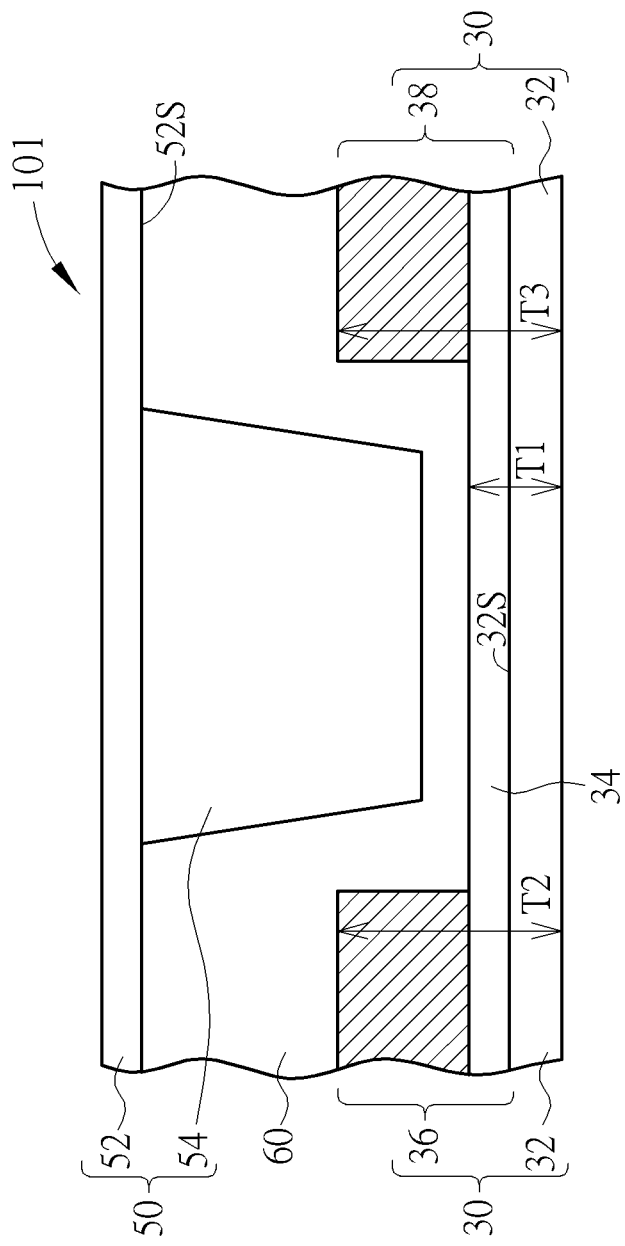
FIG. 2B is a cross-sectional view diagram of the display panel according to the first embodiment of the present invention.

Referring to FIG. 2A and FIG. 2B, FIG. 2A is a schematic diagram of the top view of the display panel according to the first embodiment of the present invention, and FIG. 2B is a cross-sectional view diagram of the display panel according to the first embodiment of the present invention. As shown in FIG. 2A and FIG. 2B, the display panel 101 of this embodiment of a present invention includes a first substrate structure 30, a second substrate structure 50 and a display medium layer 60. The first substrate structure 30 includes a first substrate 32, a transmitting line 34, a first protrusion structure 36 and a second protrusion structure 38. The first substrate 32 has a first surface 32S. The transmitting line 34 is disposed on the first surface 32S of the first substrate 32 and extends along a first direction D1. The first protrusion structure 36 and the second protrusion structure 38 are disposed on the first surface 32S of the first substrate 32, wherein the first protrusion structure 36 and the second protrusion structure 38 are overlapping with the transmitting line. According to this embodiment, the first protrusion structure 36 and the second protrusion structure 38 are disposed on the transmitting line 34, but not limited thereto. In this embodiment, the first substrate 32 may be an array substrate which a plurality of pixels (or sub-pixels) are disposed on. The transmitting line 34 may be a scan line (or gate line), but not limited thereto. The first substrate structure 30 may further include a first data line DL1 and a second data line DL2 disposed adjacent to each other (that is to say, there is no data line disposed between the first data line DL1 and the second data line DL2), wherein the first data line DL1 and the second data line DL2 are disposed on the first substrate 32 and extend along a second direction D2 and they interlace with the transmitting line (the scan line) 34. For example, the first direction D1 and the second direction D2 may be substantially perpendicular, that is to say, both the first data line DL1 and the second data line DL2 may be substantially perpendicular to the transmitting line (the scan line) 34, but not limited thereto. The first protrusion structure 36 of this embodiment includes a first thin film transistor electrically connected to the transmitting line (the scan line) 34 and the first data line L1, and the second protrusion structure 38 includes a second thin film transistor electrically connected to the transmitting line (the scan line) 34 and the second data line DL2. In this embodiment, the first thin film transistor and the second thin film transistor may be a bottom gate thin film transistor, a top gate thin film transistor or other types of thin film transistors, but not limited thereto. In addition, in the variation of the embodiment, the first protrusion structure 36 and the second protrusion structure 38 may be other protrusion structures about the first surface 32S of the first substrate 32, such as a storage capacitor structure, a pixel electrode, data line or other the protrusion structure. The first substrate structure 30 may further includes a plurality of pixel electrodes PE disposed on the first substrate 32 and electrically connected to the corresponding thin film transistor, and the pixel electrode PE thereby can be driven by the thin film transistor. For example, referring to FIG. 2A, the first thin film transistor of the first protrusion structure 36 is adjacent to the upper edge of the transmitting line (the scan line) 34 and electrically connected to the pixel electrode PE disposed adjacent to the upper edge of transmitting line (the scan line) 34, and the second thin film transistor of the second protrusion structure 38 is adjacent to the lower edge of the transmitting line (the scan line) 34 and electrically connected to the pixel electrode PE disposed adjacent to the lower edge of the transmitting line (the scan line) 34, but not limited thereto.

The second substrate structure 50 is set opposite to the first substrate structure 30, and the second substrate structure 50 includes a second substrate 52 and a first spacer 54. The second substrate 52 has a second surface 52S, wherein the second surface 52S faces the first surface 32S. The first spacer 54 is disposed on the second surface 52S of the second substrate 52 and extends towards the first substrate 32. The material of the first spacer 54 may include organic photosensitive material such as photoresist on which photolithography can be used to form the first spacer, but not limited thereto. A shape of a vertical projection of the first spacer 54 projected on the first surface 32S is a polygonal shape. Precisely, the shape of a vertical projection of the first spacer 54 projected on the first surface 32S is a polygonal shape but not rectangular and the vertical projection of the first spacer 54 is disposed between the first protrusion structure 36 and the second protrusion structure 38. The polygonal shape has a plurality of sides and a plurality of included angles which are between any two adjacent sides of the polygonal shape respectively, wherein the sides comprise at least a first side 541, a second side 542, and a third side 543, and the included angles comprise a first included angle a1 and a second included angle a2. The first side 541 and the second side 542 are parallel with the transmitting line 34, the third side 543 is connected between the first side 541 and the second side 542, the first included angle a1 is between the first side 541 and the third side 543, and the second included angle a2 is between the second side 542 and the third side 543. The first included angle a1 is an obtuse angle which is greater than 90 degrees, and the second included angle a2 is an acute angle which is less than 90 degrees. For example, the shape of the vertical projection of the first spacer 54 of this embodiment on the first surface 32S is a parallelogram which further includes a fourth side 544 connected between the first side 541 and the second side 542 and parallel with the third side 543, wherein the third side 543 and the fourth side 544 may be adjacent to the first protrusion structure 36 and the second protrusion structure 38 respectively.

Specifically, the fourth side 544 of the polygonal shape of the vertical projection of the first spacer 54 projected on the first surface 32S is connected between the first side 541 and the second side 542, the included angles further include a third included angle a3 and a fourth included angle a4, the third included angle a3 is between the first side 541 and the fourth side 544, and the fourth included angle a4 is between the second side 542 and the fourth side 544, wherein the third included angle a3 is less than 90 degrees and the fourth included angle a4 is greater than 90 degrees, that is to say, the second included angle a2 and the third included angle a3 are acute angles, and the first included angle a1 and the fourth included angle a4 are obtuse angles. In this embodiment, the second included angle a2 is between the second side 542 and the third side 543, the second included angle a2 is adjacent to the first protrusion structure 36 (that is the first thin film transistor), the third included angle a3 is between the first side 541 and the fourth side 544, and the third included angle a3 is adjacent to the second protrusion structure 38 (that is the second thin film transistor). In addition, the second included angle a2 and the first protrusion structure 36 at least partially overlap along the second direction D2, and the third included angle a3 and the second protrusion structure 38 at least partially overlap along the second direction D2. Moreover, the first included angle a1 and the fourth included angle a4 are disposed between the second included angle a2 and the third included angle a3 respectively and opposing to each other.

In this embodiment, the first spacer 54 and the first substrate structure 30 are not in contact. Precisely, the first spacer 54 may be a sub spacer. When the display panel 101 is in the normal condition (for example not being pressed), the first spacer 54 cannot contact the first substrate structure 30. However, when the display panel 101 suffers a press or deformation, the first spacer 54 can provide a function to support the first substrate structure 30 and the second substrate structure 50. In addition, the specific shape of the first spacer 54 can decrease the area of the protrusion structures covered by the first spacer 54, thereby decreasing the damage of the displaying quality caused by over deformation and increasing the tolerance of the process deviation. Furthermore, the vertical projection of the first spacer 54 on the first substrate 32 and the vertical projection of the transmitting line 34 overlap, and the vertical projection of the first spacer 54 is disposed between a center of a pattern of a vertical projection of the first protrusion structure 36 on the first substrate 62 and a center of a pattern of a vertical projection of the second protrusion structure 38 on the first substrate 62. In other words, the vertical projection of the first spacer 54 is situated at a straight connection line (imaginary line) between the center of the pattern of the vertical projection of the first protrusion structure 36 on the first substrate 62 and the center of the pattern of the vertical projection of the second protrusion structure 38 on the first substrate 62. That is, the vertical projection of the first spacer 54 is disposed to overlap the path (imaginary line) between the center of the pattern of the vertical projection of the first protrusion structure 36 on the first substrate 62 and the center of the pattern of the vertical projection of the second protrusion structure 38 on the first substrate 62. The display medium layer 60 is disposed between the first substrate structure 30 and the second substrate structure 50. In this embodiment, The first spacer 54, the first protrusion structure 36 and the second protrusion structure 38 are disposed between the first data line DL1 and the second data line DL2 which are adjacent. For example, the transmitting line 34 of this embodiment may be a scan line and separate the pixel into two parts by penetrating the pixel, wherein the pixel electrodes PE of the two parts are electrically connected to the first protrusion structure 36 (that is the first thin film transistor) and the second protrusion structure 38 (that is the second thin film transistor) respectively, and they can receive different signals to make the tilted angle of the liquid crystal different and solve the problem of color deviation in large viewing angle, but not limited thereto. In the above scheme, the vertical projection of the first spacer 54, the first protrusion structure 36 and the second protrusion structure 38 on the first substrate 32 may be disposed in the same pixel. In a variation of the embodiment, the pixels disposed at two sides of the transmitting line 34 maybe two different pixels, that is to say, the vertical projection of the first spacer 54, the first protrusion structure 36 and the second protrusion structure 38 on the first substrate 32 may be disposed between adjacent pixels. It should be noted that the pixel of this invention may represent a sub-pixel that only displays one single color, such as red sub-pixel, green sub-pixel or blue sub-pixel, and not be a full color pixel, such as the combination of red sub-pixel, green sub-pixel and blue sub-pixel. Moreover, the shape of the vertical projection of the first protrusion structure 36 on the first surface 32S includes a first shape, wherein the first shape has a side 361 which is adjacent to one of the sides of the polygonal shape such as the third side 543, and the side of the polygonal shape such as the third side 543 is parallel with the side 361 of the first shape. The shape of the vertical projection of the second protrusion structure 38 on the first surface 32S includes a second shape, wherein the second shape has a side 381 which is adjacent to another of the sides of the polygonal shape such as the fourth side 544, and another side of the polygonal shape such as the fourth side 544 is parallel with the side 381 of the second shape.

In this embodiment, the first spacer 54 and the first protrusion structure 36 and/or the second protrusion structure 38 partially overlap along a horizontal direction such as the second direction D2. In addition, the first substrate structure 30 has a first thickness T1, a second thickness T2 and a third thickness T3, wherein the first thickness T1 corresponding to a location of the vertical projection of the first spacer 54 on the first substrate 32S, the second thickness T2 corresponding to a location of the vertical projection of the first protrusion structure 36 on the first surface 32S, and the third thickness T3 corresponding to a location of the vertical projection of the second protrusion structure 38 on the first surface 32S. The second thickness T2 is greater than the first thickness T1, and the difference between the second thickness T2 and the first thickness T1 is greater than or equal to the tolerance value of the gap of the liquid crystal for example 0.03 micrometers (um). The third thickness T3 is greater than the first thickness T1, and the difference between the third thickness T3 and the first thickness T1 is greater than or equal to the tolerance value of the gap of the liquid crystal for example 0.03 micrometers (um). Especially, the first thickness T1, the second thickness T2 and the third thickness T3 said above are corresponding the total thickness of all layers of the first substrate structure 30, for example, the thicknesses of the insulating layer, protective layer and assignment layer disposed on the first substrate 32 are each a partial of the thickness of the first substrate structure 30.

When the difference between the second thickness T2 (or the third thickness T3) and the first thickness T1 is greater than or equal to the tolerance value for example 0.03 um, the gap between the first substrate structure 30 and the second substrate structure 50 would increase greater than 0.03 um and the displaying would be influenced seriously if the first spacer 54 displaces or shifts on the first protrusion structure 36 or the second protrusion structure 38. To solve this problem, the first spacer 54 of the display panel 101 of this embodiment has features said below. First, the first side 541 and the second side 542 of the polygonal shape of the vertical projection of the first spacer 54 on the first surface 32S are parallel with the edge of the transmitting line 34 and not exceed the edge of the transmitting line 34. In the condition of abiding by the design rule, the design which the first side 541 and the second side 542 are parallel with the transmitting line 34 can increase the overlapping area of the first spacer 54 and the first substrate structure 30 and not change the aperture ratio. In addition, the second included angle a2 and the third included angle a3 of the polygonal shape of the vertical projection of the first spacer 54 on the first surface 32S are less than 90 degrees, the second included angle a2 is adjacent to the first protrusion structure 36 and at least partially overlap with the first protrusion structure 36 along the second direction D2, and the third included angle a3 is adjacent to the second protrusion structure 38 and at least partially overlap with the second protrusion structure 38 along the second direction D2. Therefore, in the condition of abiding by the design rule, the design of the second included angle a2 and the third included angle a3 can increase the overlapping area of the first spacer 54 and the first substrate structure 30 and not change the aperture ratio, thereby using idle area of the transmitting line 34. In the other hand, the first included angle a1 and the fourth included angle a4 are obtuse angles, and comparing with the design of the acute angle, the design of the obtuse angle can maintain the height easily in the exposure process, so the stability and the reliability of the first spacer 54 can be promoted. The experiment result shows that the ratio between the area of the spacer 22 and the area of the pixel in the control embodiment is approximate 0.58%, and the ratio between the area of the spacer 54 and the area of the pixel in this embodiment is approximate 0.74%, that is to say, in this embodiment, the ratio between the area of the spacer and the area of the pixel increases approximately 27% in the condition of no change of the aperture ratio.

According to the above description, in the condition of no change of the aperture ratio, the shape design of the first spacer 54 of this invention can increase the area of the first spacer 54 and decrease the risk that the first spacer 54 displaces and vertically overlaps with the first protrusion structure 36 or the second protrusion structure 38, as well as the vertically overlapping area. Accordingly, the first spacer 54 is not easy to displace or be shifted on the first protrusion structure 36 or the second protrusion structure 38 because of being impacted or beaten by an external force. Therefore, the gap between the first substrate structure 30 and the second substrate structure 50 cannot increase, so the problems of vacuum bubbles, dislocation light leakage and mura can be decreased. Or, if the first spacer 54 displaces or is shifted on the first protrusion structure 36 or the second protrusion structure 38 because of being impacted or beaten by an external force, the shape design of the first spacer 54 can decrease the area where the first protrusion structure 36 and the second protrusion structure 38 overlap.

The display panel of this invention is not limited to the above embodiments. Further embodiments of the display panel are set out below. To compare each embodiment conveniently and simplify the description, each embodiment has the same device labeled with the same symbol. The description just descripts the differences between each embodiment, and repeated parts will not be redundantly described.

Figure 3A:
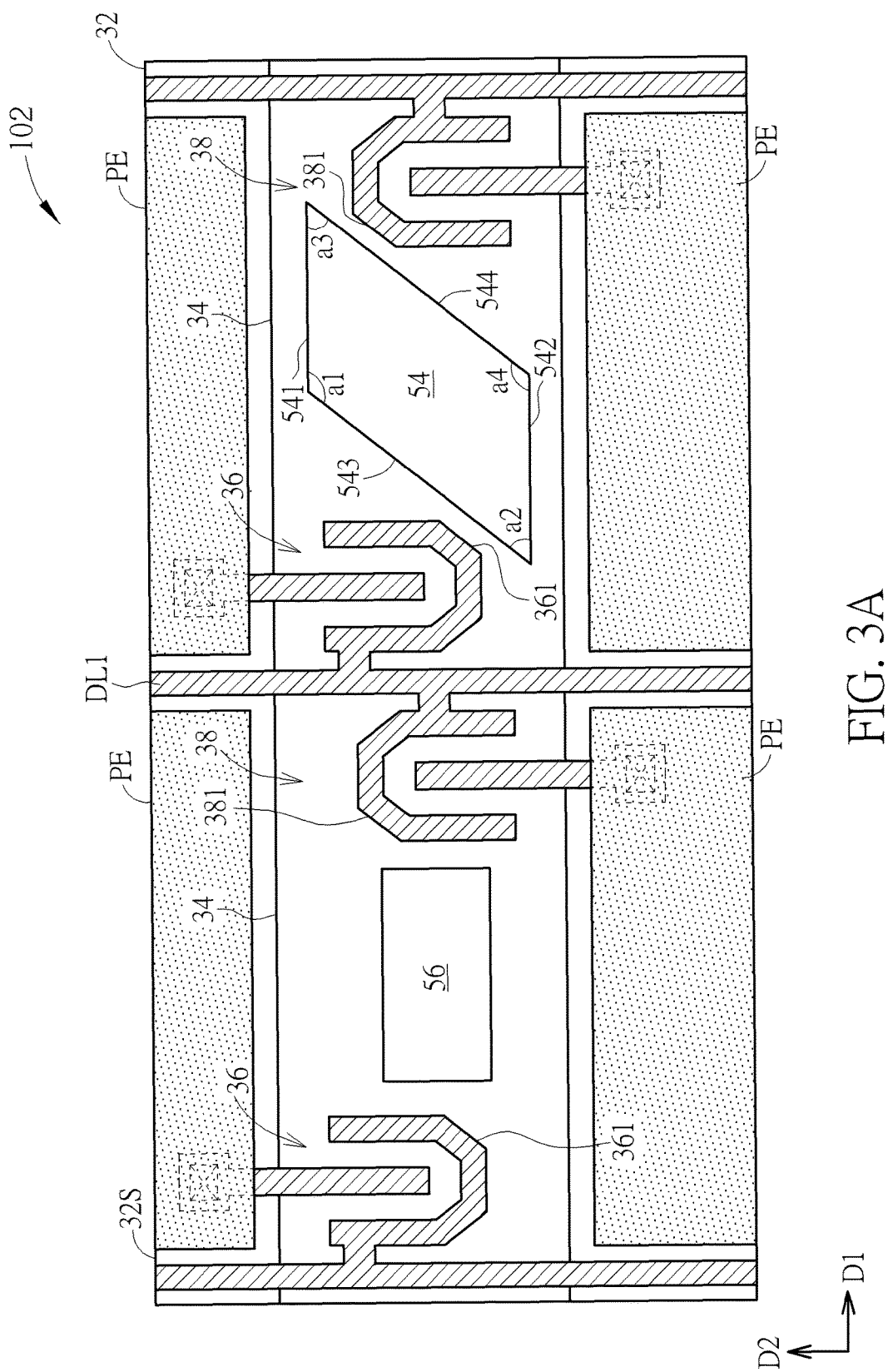
FIG. 3A is a schematic diagram of the top view of the display panel according to the second embodiment of the present invention.
Figure 3B:
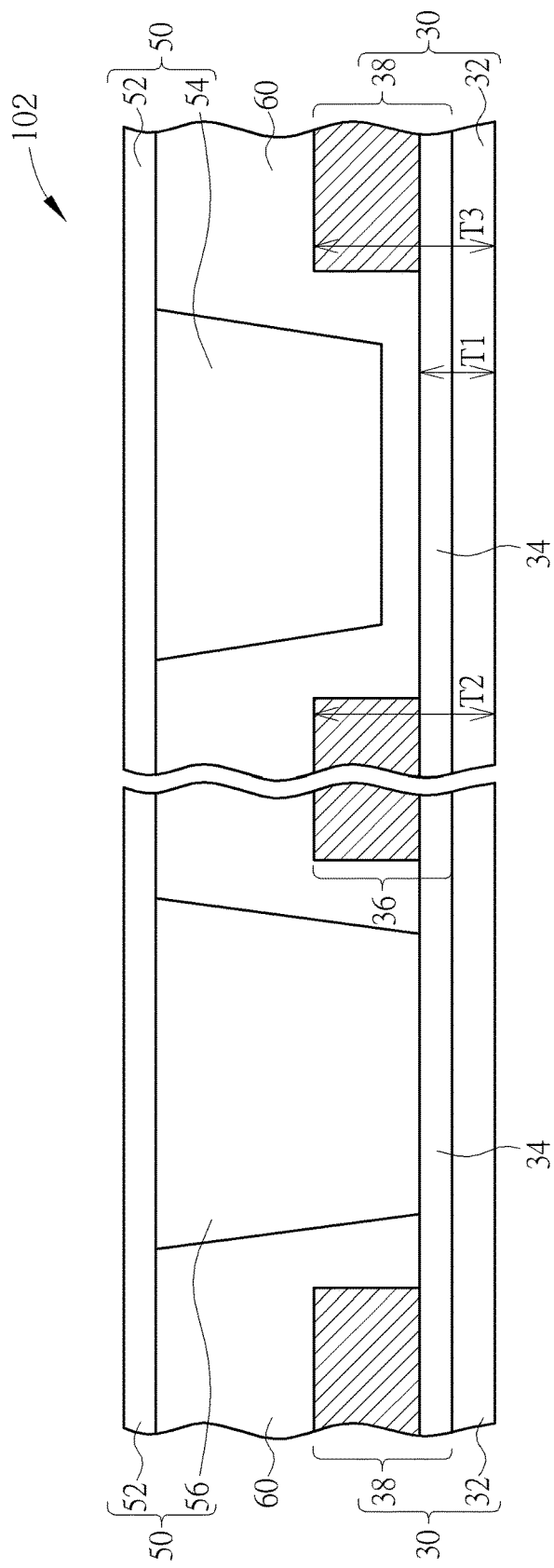
FIG. 3B is a cross-sectional view diagram of the display panel according to the second embodiment of the present invention.

Referring to FIG. 3A and FIG. 3B, FIG. 3A is a schematic diagram of the top view of the display panel according to the second embodiment of the present invention, and FIG. 3B is a cross-sectional view diagram of the display panel according to the second embodiment of the present invention. As shown in FIG. 3A and FIG. 3B, in the second embodiment, the difference from the display panel of the first embodiment is the display panel 102 may further include a second spacer 56 disposed on the second substrate 52, wherein the height of the second spacer 56 is greater than the height of the first spacer 54. For example, the second spacer 56 may contact the first substrate structure30, but the first spacer 54 does not contact the first substrate structure 30. Precisely, the second spacer 56 of this embodiment may be a main spacer, and the first spacer 54 maybe a sub spacer. When the display panel 101 is in the normal condition (for example not being pressed), the second spacer 56 can contact the first substrate structure 30 and support the first substrate structure 30 and the second substrate structure 50. The first spacer 54 cannot contact the first substrate structure 30. But, when the display panel 101 is beaten or generates the deformation, the first spacer 54 can support the first substrate structure 30 and the second substrate structure 50 to avoid the damage by serious deformation. The second spacer 56 of this embodiment may be disposed on the transmitting line 34 which is between another first protrusion structure 36 and another second protrusion structure 38, but not limited thereto. The shape of a vertical projection of the second spacer 56 projected on the first surface 32S may be any polygonal shape, and the second spacer 56 and the first spacer 54 maybe the same or different shape. For example, the shape of a vertical projection of the second spacer 56 projected on the first surface 32S may be rectangular, but not limited thereto. Moreover, the first spacer 54 and the second spacer 56 are not limited to be disposed in the adjacent pixel, and they are not limited to be disposed between the first protrusion structure 36 and the second protrusion structure 38. The location and number of the first spacer 54 and the second spacer 56 can be adjusted by requirement, for example, the number of the first spacer 54 may be greater than the number of the second spacer 56, but not limited thereto. In the variety of the embodiment, the second spacer 56 may be disposed on the first substrate 32 and contact the second substrate structure 50.

Figure 4:
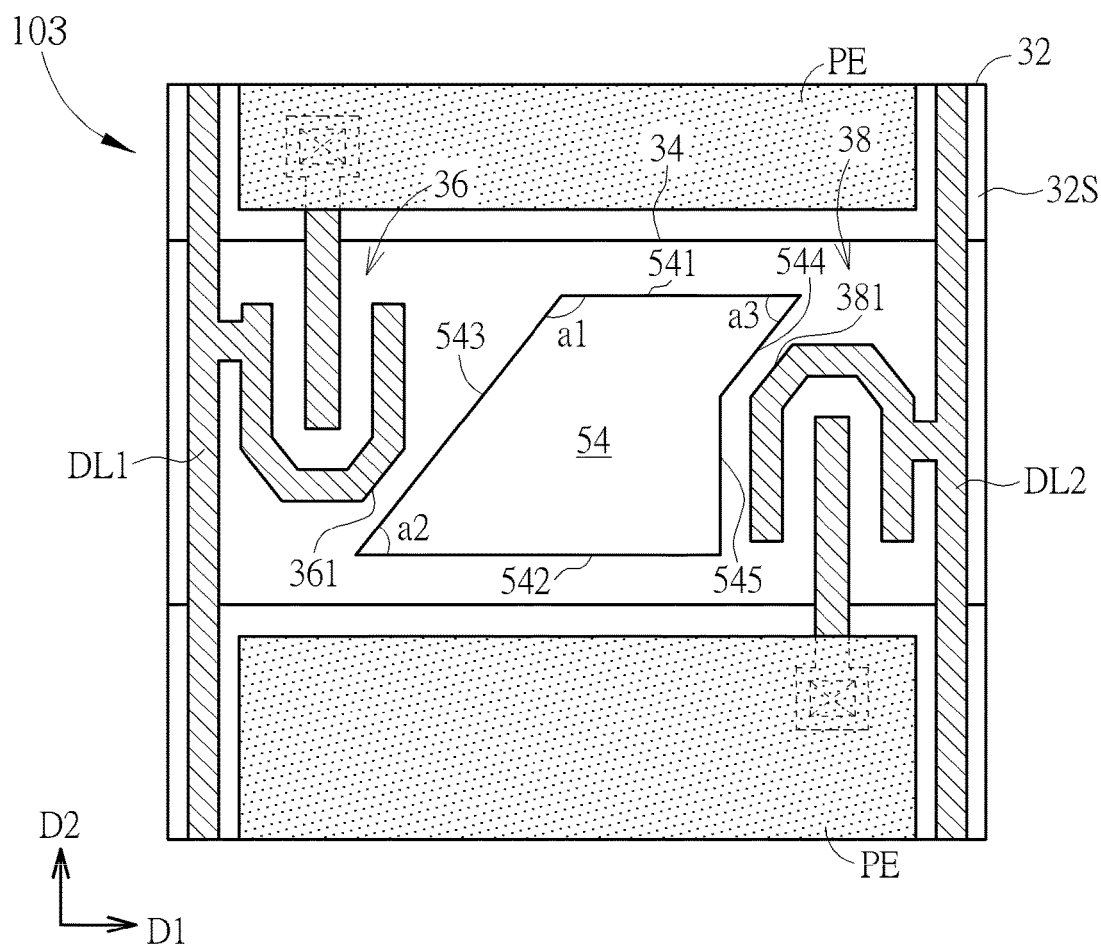
FIG. 4 is a schematic diagram of the top view of the display panel according to the third embodiment of the present invention.

Referring to FIG. 4, FIG. 4 is a schematic diagram of the top view of the display panel according to the third embodiment of the present invention. As shown in FIG. 4, the difference between the display panel 103 of the third embodiment and the display panel 101 of the first embodiment is the shape of the vertical projection of the first spacer 54 projected on the first surface 32S is a pentagon including a first side 541, a second side 542, a third side 543, a fourth side 544, a fifth side 545, a first included angle a1, a second included angle a2 and a third included angle a3. The first side 541 and the second side 542 may be parallel with the transmitting line 34, the third side 543 is connected between the first side 541 and the second side 542, the fourth side 544 is connected between the first side 541 and the fifth side 545, and the fifth side 545 is connected between the second side 542 and the fourth side 544. The first included angle a1 is between the first side 541 and the third side 543, the second included angle a2 is between the second side 542 and the third side 543, and the third included angle a3 is between the first side 541 and the fourth side 544. The first included angle a1 is an obtuse angle which is greater than 90 degrees, and the second included angle a2 and the third included angle a3 are acute angles which are less than 90 degrees.

The second included angle a2 is adjacent to the first protrusion structure 36 (that is the first thin film transistor), and the third included angle a3 is adjacent to the second protrusion structure 38 (that is the second thin film transistor). In addition, the second included angle a2 and the first protrusion structure 36 at least partially overlap along the second direction D2, and the third included angle a3 and the second protrusion structure 38 at least partially overlap along the second direction D2. Moreover, the side 361 of the first shape of the vertical projection of the first protrusion structure 36 on the first surface 32S is parallel and adjacent to one of the sides of the pentagon such as the third side 543, and the side 381 of the second shape of the vertical projection of the second protrusion structure 38 on the first surface 32S is parallel and adjacent to another of the sides of the pentagon such as the fourth side 544, but not limited thereto.

As the above embodiment, the pentagon design of the first spacer 54 of this embodiment can increase the area of the first spacer 54, thereby increasing friction between the first spacer 54 and the first substrate structure 30 and decreasing the risk that the first spacer 54 displaces and vertically overlaps with the adjacent protrusion structure, as well as the vertically overlapping area. The problems of vacuum bubbles, dislocation light leakage and mura can be decreased.

Figure 5:
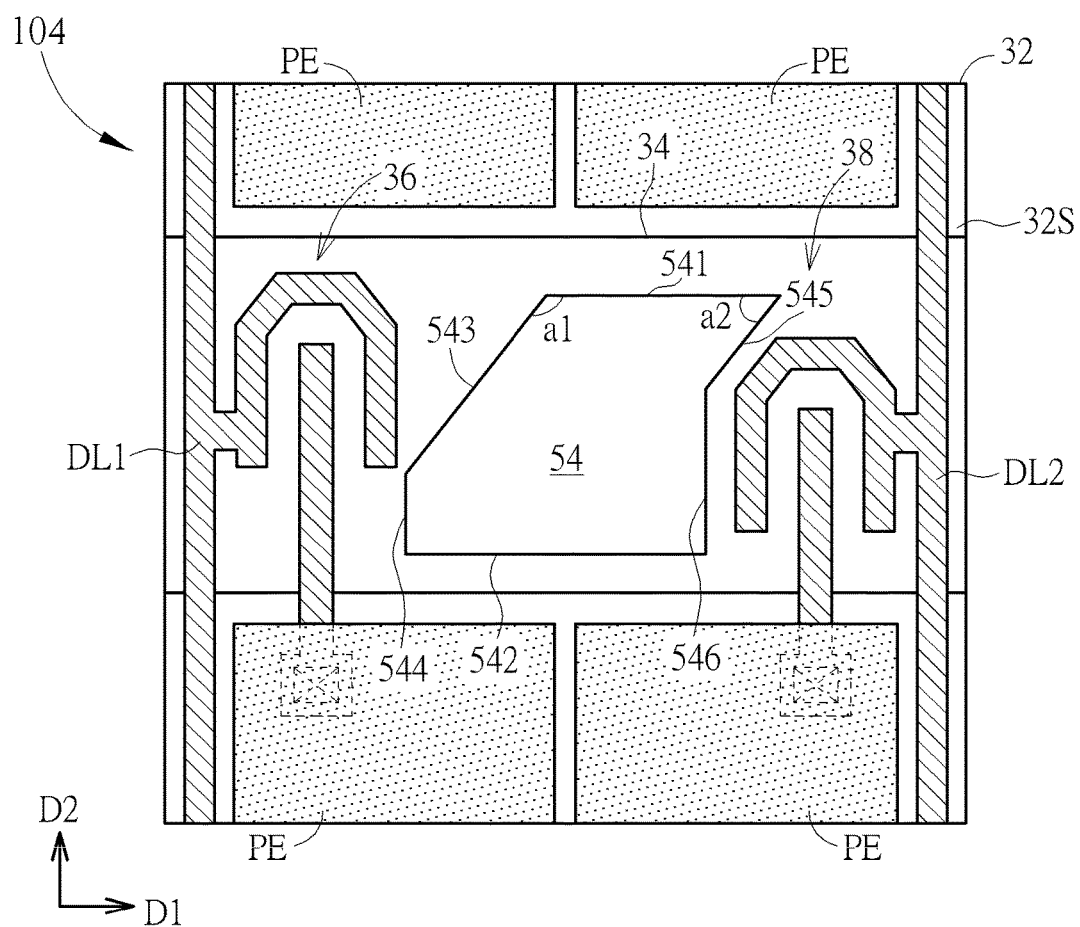
FIG. 5 is a schematic diagram of the top view of the display panel according to the fourth embodiment of the present invention.

Referring to FIG. 5, FIG. 5 is a schematic diagram of the top view of the display panel according to the fourth embodiment of the present invention. As shown in FIG. 5, in the display panel 104 of the fourth embodiment, the shape of the vertical projection of the first spacer 54 projected on the first surface 32S is a hexagon including a first side 541, a second side 542, a third side 543, a fourth side 544, a fifth side 545, a sixth side 546, a first included angle a1 and a second included angle a2. The first side 541 and the second side 542 may be parallel with the transmitting line 34, the first side 541 is connected to the third side 543, the fifth side 545 is connected between the first side 541 and the sixth side 546, the first included angle a1 is between the first side 541 and the third side 543, and the second included angle a2 is between the first side 541 and the fifth side 545. The first included angle a1 is an obtuse angle which is greater than 90 degrees, and the second included angle a2 is an acute angle which is less than 90 degrees. In addition, the fourth side 544 is connected between the second side 542 and the third side 543, and the sixth side 546 is connected between the fifth side 545 and the second side 542. Moreover, the second included angle a2 is adjacent to the second protrusion structure 38 (that is the second thin film transistor), and the second included angle a2 and the second protrusion structure 38 at least partially overlap along the second direction D2. In this embodiment, a row between the each two adjacent data lines has two pixel electrode PE, the first thin film transistor of the first protrusion structure 36 and the second thin film transistor of the second protrusion structure 38 are electrically connected to the pixel electrodes PE which is below the transmitting line (the scan line) 34, but not limited thereto.

As the above embodiment, the hexagonal design of the first spacer 54 of this embodiment can increase the area of the first spacer 54, thereby increasing friction between the first spacer 54 and the first substrate structure 30 and decreasing the risk the first spacer 54 displaces and vertically overlaps with the adjacent protrusion structure, as well as the vertically overlapping area. Therefore, the problems of vacuum bubbles, dislocation light leakage and mura can be decreased.

Figure 6:
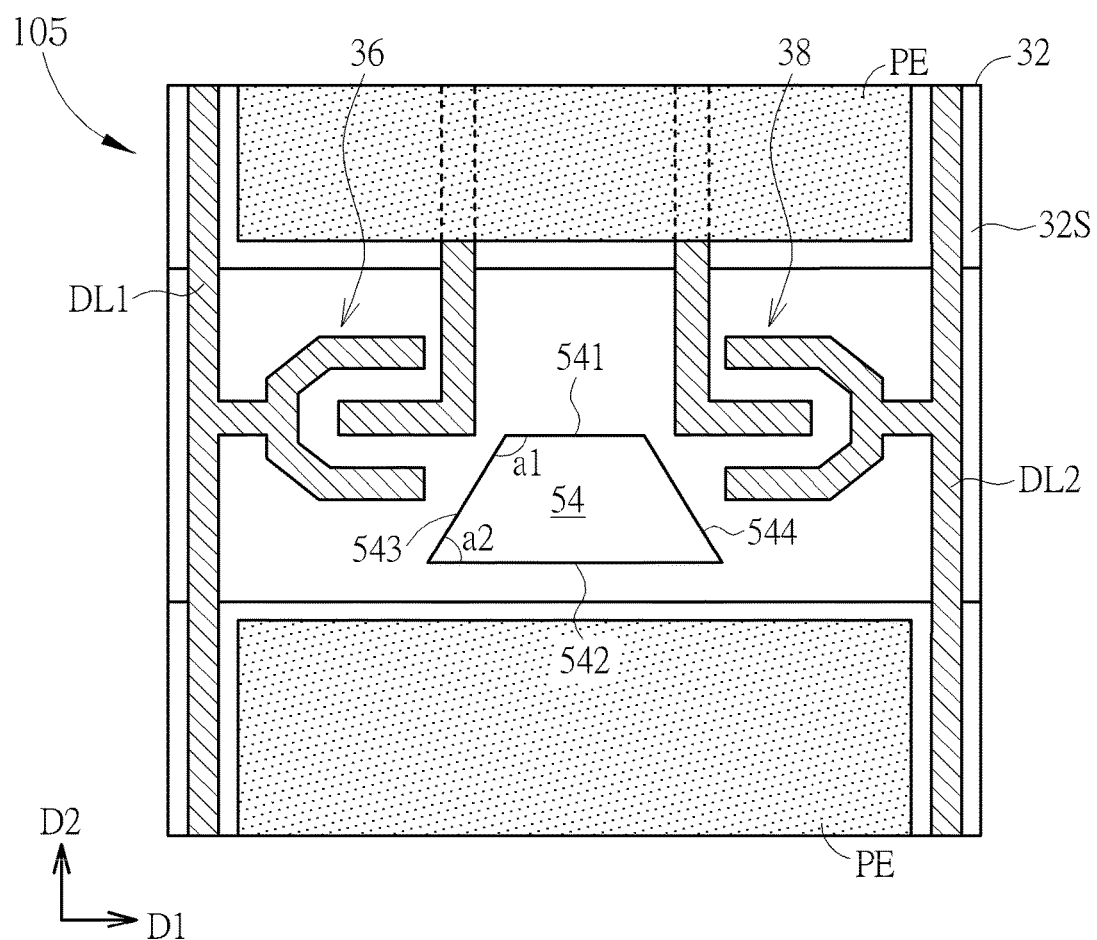
FIG. 6 is a schematic diagram of the top view of the display panel according to the fifth embodiment of the present invention.

Referring to FIG. 6, FIG. 6 is a schematic diagram of the top view of the display panel according to the fifth embodiment of the present invention. As shown in FIG. 6, in the display panel 105 of the fifth embodiment, the shape of the vertical projection of the first spacer 54 projected on the first surface 32S is a trapezoid including a first side 541, a second side 542, a third side 543, a fourth side 544, a first included angle a1 and a second included angle a2. The first side 541 and the second side 542 may be parallel with the transmitting line 34, the third side 543 is connected between the first side 541 and the second side 542, and the fourth side is connected between the first side 541 and the second side 542. The first included angle a1 is between the first side 541 and the third side 543, and the second included angle a2 is between the second side 542 and the third side 543. The first included angle a1 is an obtuse angle which is greater than 90 degrees, and the second included angle a2 is an acute angle which is less than 90 degrees. In addition, the fourth side 544 and the first side 541 are not perpendicular to each other. For example, in this embodiment, the first protrusion structure 36 and the second protrusion structure 38 are the structures which are symmetric to each other, the fourth side 544 and the third side 543 of the first spacer 54 may be symmetric to each other and form the regular trapezoid, but not limited thereto, and also may be a trapezoid which the two sides are non-symmetric. In the variety of the embodiment, the disposed angle of the fourth side 544 of the first spacer 54 can be determined according to the structures of the first protrusion structure 36 and the second protrusion structure 38, for example, the fourth side 544 and the first side 541 may be perpendicular to each other.

As the above embodiment, the trapezoid design of the first spacer 54 of this embodiment can increase the area of the first spacer 54, thereby increasing friction between the first spacer 54 and the first substrate structure 30 and decreasing the risk that the first spacer 54 displaces and vertically overlaps with the adjacent protrusion structure, as well as the vertically overlapping area. Therefore, the problems of vacuum bubbles, dislocation light leakage and mura can be decreased.

Figure 7:
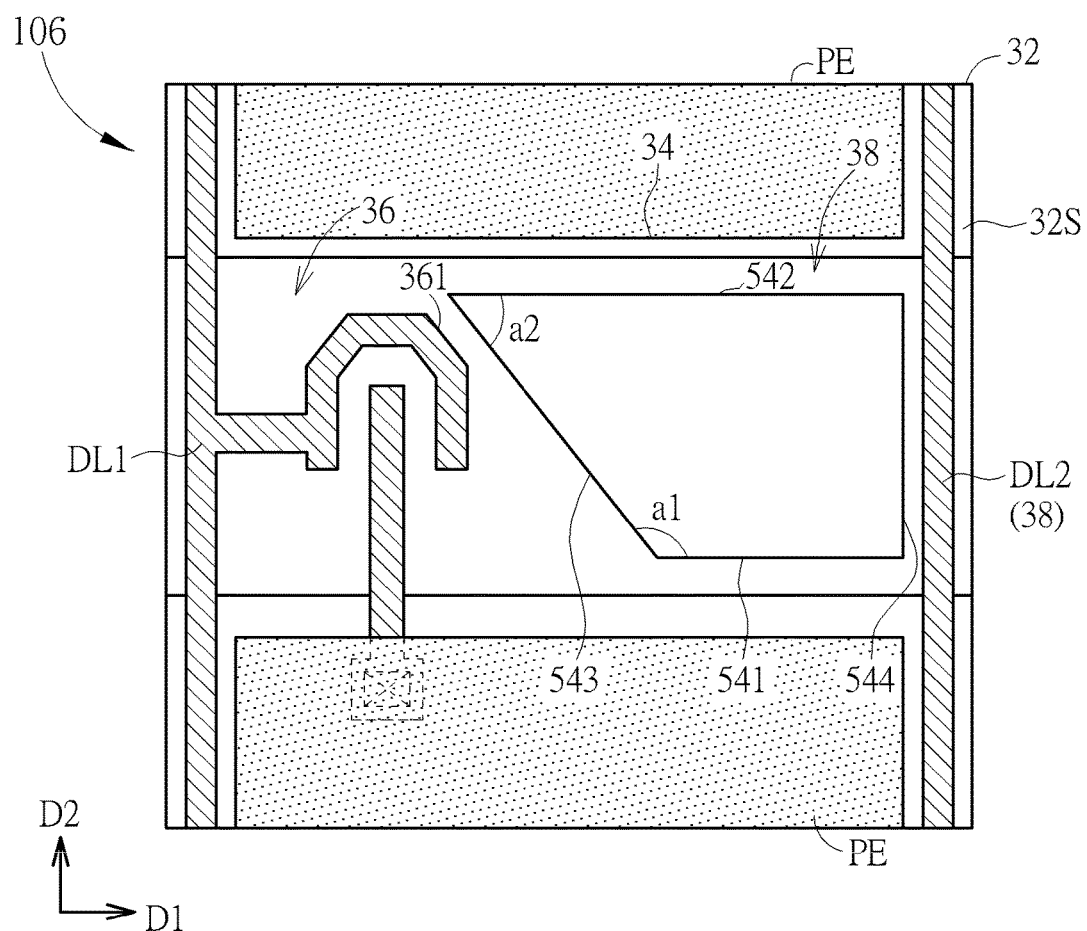
FIG. 7 is a schematic diagram of the top view of the display panel according to the sixth embodiment of the present invention.

Referring to FIG. 7, FIG. 7 is a schematic diagram of the top view of the display panel according to the sixth embodiment of the present invention. As shown in FIG. 7, in the display panel 106 of the sixth embodiment, the first protrusion structure 36 includes a first thin film transistor electrically connected to the transmitting line (the scan line) 34 and the first data line DL1, and the second protrusion structure 38 includes a protrusion structure formed by the second data line DL2, the transmitting line 34 and other layers which may be disposed at this area. In addition, the polygonal shape of the vertical projection of the first spacer 54 projected on the first surface 32S in this embodiment is a trapezoid, for example, the fourth side 544 is adjacent to the second protrusion structure 38, and the fourth side 544 is perpendicular to the first side 541 and the second side 542, but not limited thereto, and also, the polygonal shape may be the shape each embodiment of this invention describes.

Figure 8:
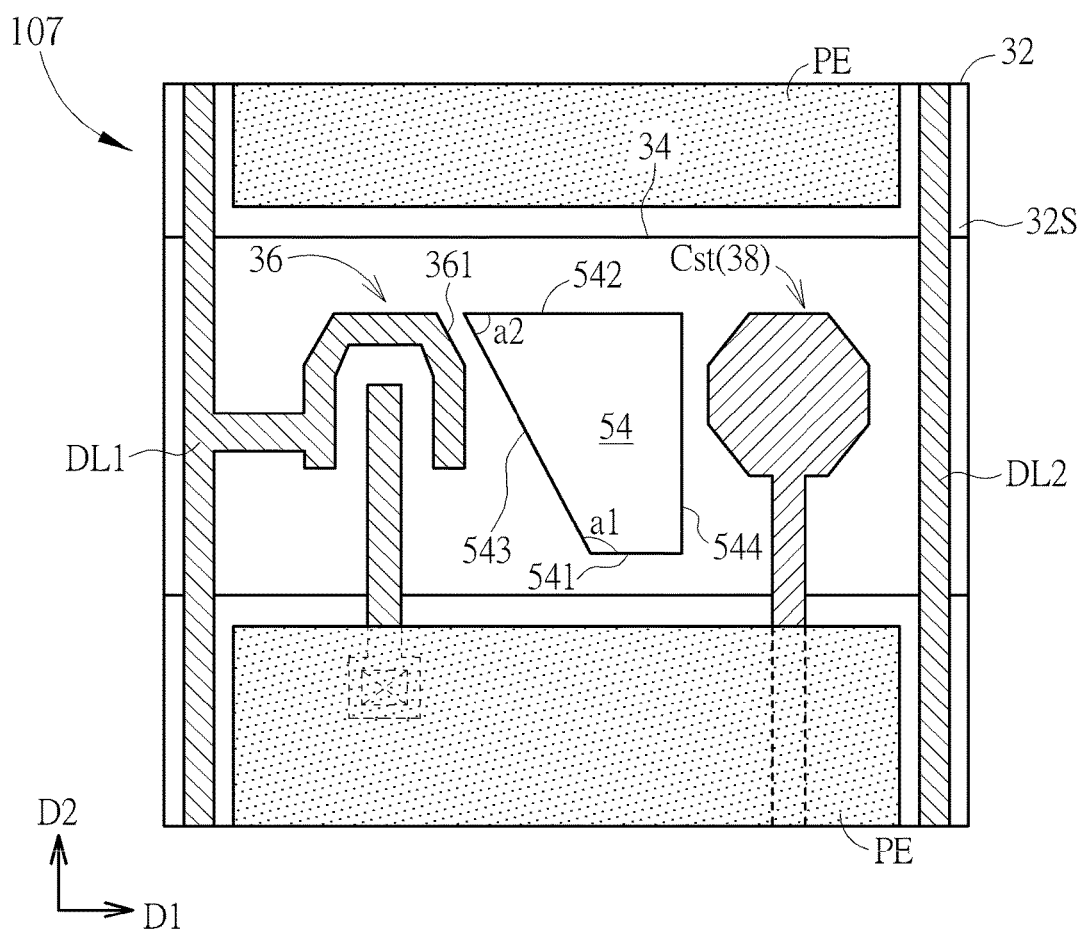
FIG. 8 is a schematic diagram of the top view of the display panel according to the seventh embodiment of the present invention.

Referring to FIG. 8, FIG. 8 is a schematic diagram of the top view of the display panel according to the seventh embodiment of the present invention. As shown in FIG. 8, in the display panel 107 of the seventh embodiment, the first protrusion structure 36 includes a first thin film transistor electrically connected to the transmitting line (the scan line) 34 and the first data line DL1, and the second protrusion structure 38 includes a storage capacitor structure Cst. In addition, the polygonal shape of the vertical projection of the first spacer 54 projected on the first surface 32S in this embodiment is a trapezoid, but not limited thereto, and also, the polygonal shape may be the shape each embodiment of this invention describes.

Figure 9:
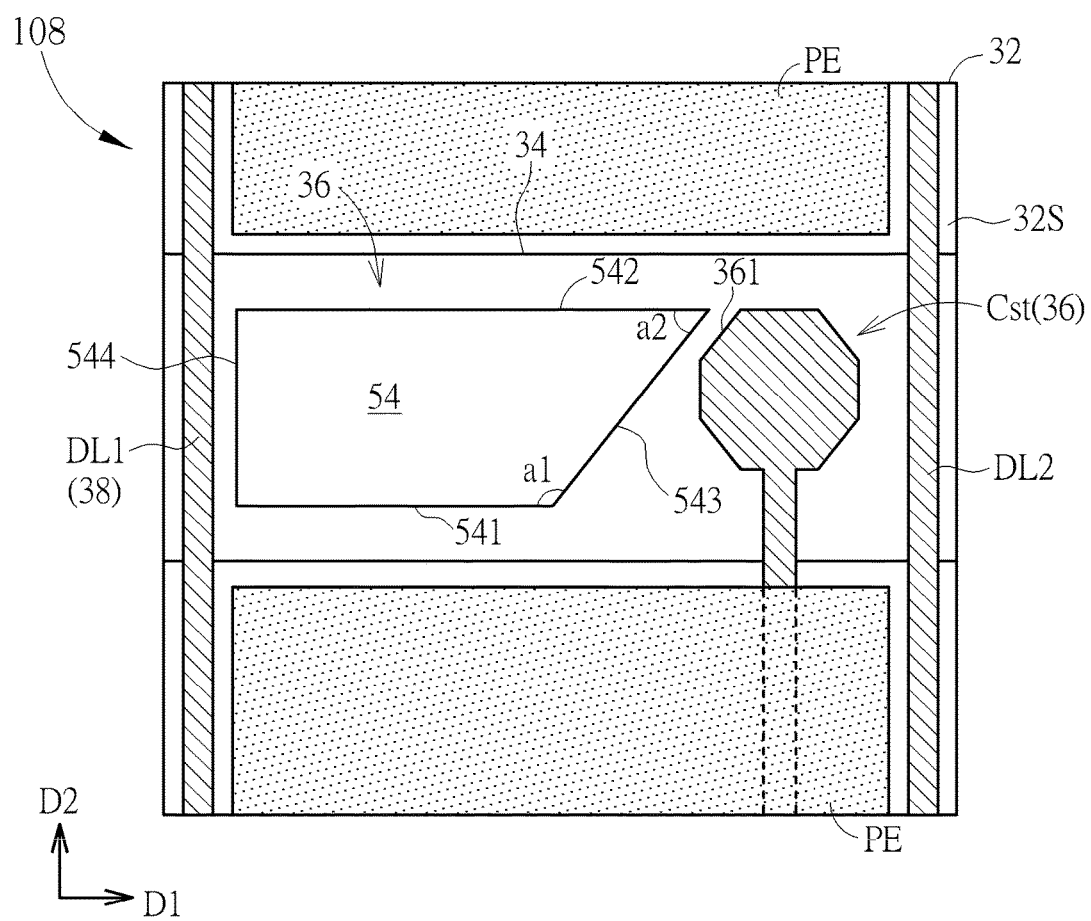
FIG. 9 is a schematic diagram of the top view of the display panel according to the eighth embodiment of the present invention.

Referring to FIG. 9, FIG. 9 is a schematic diagram of the top view of the display panel according to the eighth embodiment of the present invention. As shown in FIG. 9, in the display panel 108 of the eighth embodiment, the first protrusion structure 36 includes a storage capacitor structure Cst, and the second protrusion structure 38 includes a protrusion structure formed by the first data line DL1, the transmitting line 34 and other layers which may be disposed at this area. In addition, the polygonal shape of the vertical projection of the first spacer 54 projected on the first surface 32S in this embodiment is a trapezoid, but not limited thereto, and also, the polygonal shape may be the shape each embodiment of this invention describes.

Figure 10:
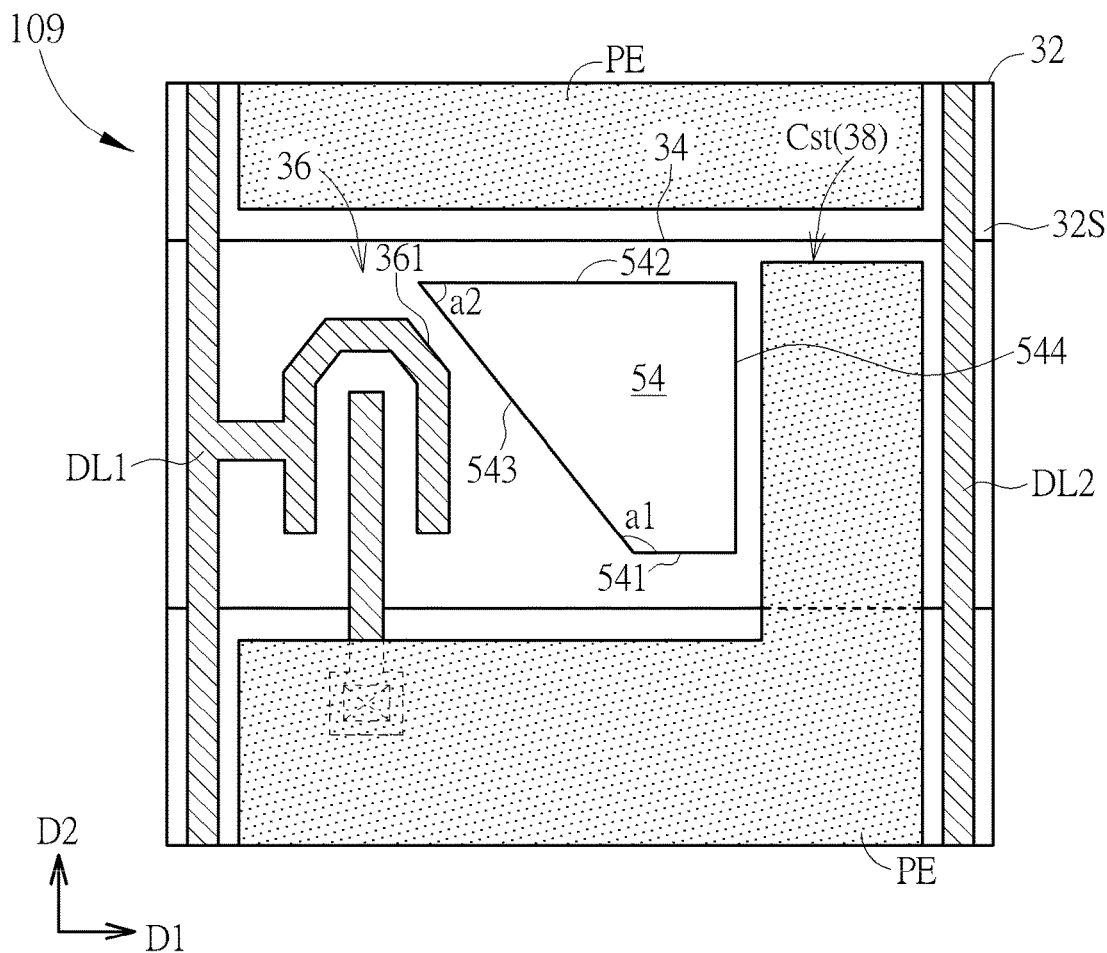
FIG. 10 is a schematic diagram of the top view of the display panel according to the ninth embodiment of the present invention.

Referring to FIG. 10, FIG. 10 is a schematic diagram of the top view of the display panel according to the ninth embodiment of the present invention. As shown in FIG. 10, in the display panel 109 of the ninth embodiment, the first protrusion structure 36 includes a first thin film transistor electrically connected to the transmitting line (the scan line) 34 and the first data line DL1, and the second protrusion structure 38 includes a protrusion structure formed by the pixel electrode PE, the transmitting line 34 and other layers which may be disposed at this area, wherein the part of the pixel electrode PE extends towards the transmitting line (the scan line) 34 and forms a storage capacitor structure Cst with the transmitting line (the scan line) 34. In addition, the polygonal shape of the vertical projection of the first spacer 54 projected on the first surface 32S in this embodiment is a trapezoid, but not limited thereto, and also, the polygonal shape may be the shape each embodiment of this invention describes.

Figure 11:
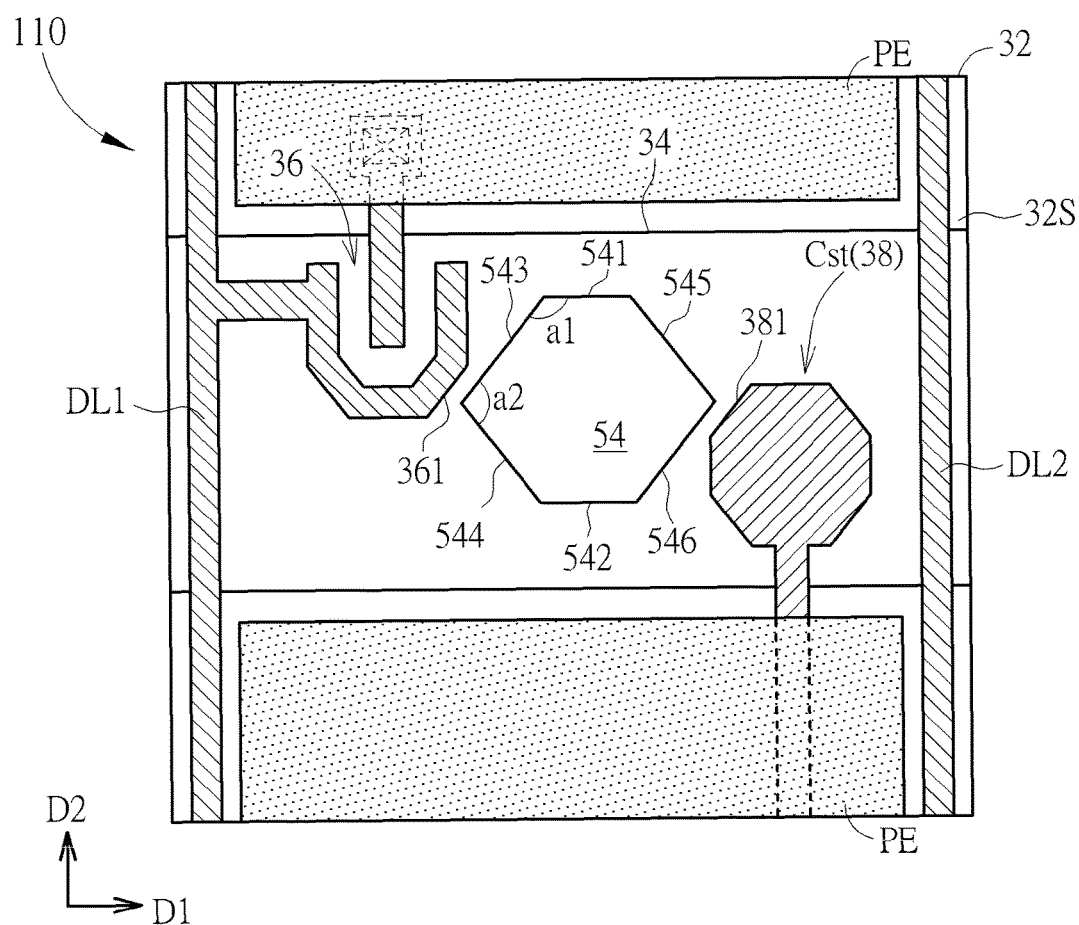
FIG. 11 is a schematic diagram of the top view of the display panel according to the tenth embodiment of the present invention.

Referring to FIG. 11, FIG. 11 is a schematic diagram of the top view of the display panel according to the tenth embodiment of the present invention. As shown in FIG. 11, in the display panel 110 of the tenth embodiment, the first protrusion structure 36 includes a first thin film transistor electrically connected to the transmitting line (the scan line) 34 and the first data line DL1, and the second protrusion structure 38 includes a storage capacitor structure Cst. In addition, the polygonal shape of the vertical projection of the first spacer 54 projected on the first surface 32S in this embodiment is a hexagon including a first side 541, a second side 542, a third side 543, a fourth side 544, a fifth side 545, a sixth side 546, a first included angle a1 and a second included angle a2. The first side 541 and the second side 542 may be parallel with the transmitting line 34, and the third side 543 is connected between the first side 541 and the fourth side 544. The first included angle a1 is between the first side 541 and the third side 543, and the second included angle a2 is between the third side 543 and the fourth side 544. The first included angle a1 is an obtuse angle which is greater than 90 degrees, and the second included angle a2 is an acute angle which is less than 90 degrees (although the angle may not be illustrated in FIG. 11 as a clearly acute angle). The fourth side 544 is connected between the second side 542 and the third side 543, the fifth side 545 is connected between the first side 541 and the sixth side 546, and the sixth side 546 is connected between the fifth side 545 and the second side 542. The polygonal shape of the vertical projection of the first spacer 54 projected on the first surface 32S is not limited, and also, the polygonal shape maybe the shape each embodiment of this invention describes.

In conclusion, in the condition of no change of the aperture ratio, the shape design of the first spacer of this invention can increase the area of the first spacer, thereby increasing friction between the first spacer and the first substrate structure and decrease the risk that the first spacer displaces and vertically overlaps with the adjacent protrusion structures, as well as the vertically overlapping area. With the above design, the first spacer is not easy to displace or be shifted on the first protrusion structure or the second protrusion structure because of being impacted or beaten by an external force. Therefore, the gap between the first substrate structure and the second substrate structure cannot increase, so the problems of vacuum bubbles, dislocation light leakage and mura can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel comprising:
   a first substrate structure comprising:
   a first substrate having a first surface;
   a transmitting line disposed on the first surface of the first substrate; and
   a first protrusion structure and a second protrusion structure disposed on the first surface of the first substrate;
   a second substrate structure comprising:
   a second substrate having a second surface, wherein the second surface faces the first surface; and
   a first spacer disposed between the first surface of the first substrate and the second surface of the second substrate, wherein a shape of a vertical projection of the first spacer projected on the first surface is a polygonal shape having a plurality of sides and a plurality of included angles between any two adjacent sides of the polygonal shape respectively, the sides comprise at least a first side, a second side, and a third side, and the included angles comprise a first included angle and a second included angle, wherein the first side and the second side are parallel with the transmitting line, the first side and the third side are connected, the first included angle is between the first side and the third side and is greater than 90 degrees, and the second included angle is less than 90 degrees, wherein the vertical projection of the first spacer on the first substrate entirely overlaps with a vertical projection of the transmitting line, and the vertical projection of the first spacer is disposed between a center of a pattern of a vertical projection of the first protrusion structure on the first substrate and a center of a pattern of a vertical projection of the second protrusion structure on the first substrate; and
   a display medium layer disposed between the first substrate structure and the second substrate structure.

2. The display panel of claim 1, wherein the polygonal shape further comprises a fourth side having an end of the fourth side connected to the first side, and the second included angle is between the fourth side and the first side.

3. The display panel of claim 2, wherein the third side is connected between the first side and the second side, a third included angle is between the third side and the second side, the third included angle is less than 90 degrees, the third included angle is adjacent to the first protrusion structure, and the second included angle is adjacent to the second protrusion structure.

4. The display panel of claim 3, wherein the transmitting line extends along a first direction, the second protrusion structure is a thin film transistor, the second included angle and the thin film transistor at least partially overlap along a second direction, and the second direction is substantially perpendicular to the first direction.

5. The display panel of claim 4, wherein the first protrusion structure is a thin film transistor, and the third included angle and the first protrusion structure at least partially overlap along the second direction.

6. The display panel of claim 1, wherein the polygonal shape further comprises a fourth side having an end of the fourth side connected to the first side, and a fourth included angle which is greater than or equal to 90 degrees is between the fourth side and the first side.

7. The display panel of claim 1, wherein a shape of the vertical projection of the first protrusion structure on the first surface comprises a first shape, and the first shape has a side which is parallel and adjacent to one of the sides of the polygonal shape.

8. The display panel of claim 7, wherein a shape of the vertical projection of the second protrusion structure on the first surface comprises a second shape, and the second shape has a side which is parallel and adjacent to one of the other sides of the polygonal shape.

9. The display panel of claim 1, wherein the first spacer is disposed on the second surface of the second substrate and extends toward the first substrate, wherein the first spacer has a free end that does not contact the first substrate or any other solid surface.

10. The display panel of claim 1, wherein the transmitting line comprises a scan line, and the first substrate structure further comprises a first data line and a second data line adjacent to each other, the first data line and the second data line are disposed on the first substrate and substantially perpendicular to the scan line, and the first spacer, the first protrusion structure and the second protrusion structure are disposed between the first data line and the second data line.

11. The display panel of claim 10, wherein the first protrusion structure comprises a first thin film transistor electrically connected to the scan line and the first data line, and the second protrusion structure comprises a second thin film transistor electrically connected to the scan line and the second data line.

12. The display panel of claim 10, wherein the first protrusion structure comprises a thin film transistor electrically connected to the scan line and the first data line, and the second protrusion structure comprises a storage capacitor structure.

13. The display panel of claim 10, wherein the first protrusion structure comprises a thin film transistor electrically connected to the scan line and the first data line, and the second protrusion structure comprises a pixel electrode.

14. The display panel of claim 10, wherein the first protrusion structure comprises a thin film transistor electrically connected to the scan line and the first data line, and the second protrusion structure comprises the second data line.

15. The display panel of claim 1, wherein the first substrate structure has a first thickness and a second thickness greater than the first thickness, the first thickness is corresponding to a location of the vertical projection of the first spacer on the first surface, the second thickness is corresponding to a location of the vertical projection of the first protrusion structure on the first surface, and the difference between the second thickness and the first thickness is greater than or equal to 0.03 micrometers (um).

16. A display panel comprising:
    a first substrate structure comprising:
    a first substrate;
    a scan line and a first data line disposed on the first substrate and interlaced with each other, wherein the scan line extends along a first direction;

a thin film transistor disposed on the scanning line of the first substrate and electrically connected to the scan line and the first data line;

a protrusion structure disposed on the first substrate and adjacent to the thin film transistor, wherein the protrusion structure and the scan line overlap; and a first pixel electrode electrically connected to the thin film transistor;

a second substrate structure opposite to the first substrate structure, the second substrate structure comprising:

a second substrate; and a first spacer disposed between the first substrate and the second substrate, wherein a shape of a vertical projection of the first spacer projected on the first substrate is a polygonal shape having a plurality of sides and a plurality of included angles which are between any two adjacent sides of the polygonal shape respectively, the sides comprise at least a first side, a second side, and a third side, and the included angles comprise a first included angle and a second included angle, wherein the first side and the second side are parallel with the scan line, the first side and the third side are connected, the first included angle is between the first side and the third side, the first included angle is greater than 90 degrees, and the second included angle is less than 90 degrees, wherein the vertical projection of the first spacer on the first substrate entirely overlaps with a vertical projection of the scan line, and the vertical projection of the first spacer is disposed between a center of a pattern of a vertical projection of the thin film transistor on the first substrate and a center of a pattern of a vertical projection of the protrusion structure on the first substrate; and a display medium layer disposed between the first substrate structure and the second substrate structure.

17. The display panel of claim 16, further comprising a second data line which is adjacent to the first data line, wherein the protrusion structure and the thin film transistor are disposed between the first data line and the second data line.

18. The display panel of claim 17, wherein the polygonal shape further comprises a fourth side having an end of the fourth side connected to the first side, and a fourth included angle which is greater than or equal to 90 degrees is between the fourth side and the first side.

19. The display panel of claim 16, wherein the vertical projection of the thin film transistor on the first substrate comprises a first shape, and the first shape has a side parallel and adjacent to one of the sides of the polygonal shape.

20. The display panel of claim 16, wherein the first spacer is disposed on the second surface of the second substrate and extends toward the first substrate, wherein the first spacer has a free end that does not contact the first substrate or any other solid surface.

* * * * *